(12) United States Patent
Wachi et al.

(10) Patent No.: US 9,444,402 B2
(45) Date of Patent: Sep. 13, 2016

(54) HIGH FREQUENCY INTEGRATED CIRCUIT AND DEVICE USING SAME

(71) Applicant: HITACHI, LTD., Chiyoda-ku, Tokyo (JP)

(72) Inventors: Yusuke Wachi, Tokyo (JP); Ichiro Somada, Tokyo (JP); Takao Okazaki, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/846,601

(22) Filed: Sep. 4, 2015

(65) Prior Publication Data

US 2016/0072434 A1  Mar. 10, 2016

(30) Foreign Application Priority Data

Sep. 5, 2014 (JP) ................................. 2014-181453

(51) Int. Cl.
*H03B 5/24* (2006.01)

(52) U.S. Cl.
CPC ....................... *H03B 5/24* (2013.01)

(58) Field of Classification Search
CPC ........................................................ H03B 5/24
USPC ............................................ 331/117 R, 44
See application file for complete search history.

(56) References Cited

U.S. PATENT DOCUMENTS

| 2011/0234204 A1 | 9/2011 | Tamura |
| 2014/0368285 A1* | 12/2014 | Lu .................... H03B 5/1228 331/117 FE |

FOREIGN PATENT DOCUMENTS

JP  2011-205280 A  10/2011

OTHER PUBLICATIONS

Supervision of translation by Kuroda (2002) "RF microelectronics" published by Maruzen, pp. 47-52.

* cited by examiner

*Primary Examiner* — Joseph Chang
(74) *Attorney, Agent, or Firm* — Miles & Stockbridge PC

(57) ABSTRACT

Provided is an amplifier with a test oscillator for a high frequency characteristic monitor, which has small power loss in a normal operation state and secures good noise performance while it is possible to equip both a transmitter IC and a receiver IC with the amplifier. In a high frequency IC including an amplifier including an inductive load and a test oscillator arranged in a same chip, the test oscillator commonly uses the inductive load of the amplifier, the amplifier has a bias voltage terminal to switch an operation state into an active state/inactive state, and the oscillator has a bias voltage terminal to switch an operation state into an active state/inactive state. In a test operation mode, the amplifier is inactivated and the test oscillator is activated and in a normal operation mode, the amplifier is activated and the test oscillator is inactivated.

14 Claims, 11 Drawing Sheets

HIGH FREQUENCY INTEGRATED CIRCUIT AND DEVICE USING SAME

CLAIM OF PRIORITY

The present application claims priority from Japanese application serial no. JP2014-181453, filed on Sep. 5, 2014, the content of which is hereby incorporated by reference into this application.

TECHNICAL FIELD

The present invention relates to a transmitter IC, a receiver IC, and a transceiver IC used for a millimeter-wave radar system, and a test circuit or a test method in an inspection at the time of a shipment thereof.

BACKGROUND ART

In Europe, the U.S., and Japan, equipping a vehicle with prevention safety systems for preventing a traffic accident from occurring has been promoted as an effort to decrease the frequency of vehicle accidents and a fatality rate thereof. Among them, systems for detecting surroundings and warning a driver of danger, such as a pre-crash safety system and a blind spot detection system, attract attention in particular. Devices that detect objects surrounding the vehicle are needed to realize these systems and, for example, a stereo camera module and a millimeter-wave radar module are used. In the case of the former, although the module can be realized at a relatively low cost, there is a problem in detection sensitivity that decreases at night. Meanwhile, in the case of the latter, although such a problem does not occur, the module has not been widely used in popular cars due to a cost, and reduction of the cost has been a problem.

One of factors causing a high cost of the millimeter-wave radar module is a high inspection cost thereof.

FIG. 1 illustrates a configuration example of an integrated circuit (IC) in a millimeter-wave radar module. In the configuration example, the IC includes seven ICs of a signal synthesizer IC 1 that generates a millimeter-wave band signal, a transmitter IC 2 that transmits a millimeter-wave signal, receiver ICs 3 to 6 that receive the millimeter-wave signal, and a baseband integrated circuit (base band) (BBIC) 7 for processing the signal received by the receiver ICs. In this example, the transmitter IC 2 includes a variable gain amplifier (PGA) and a power amplifier (PA) and each of the receiver ICs 3 to 6 includes a low noise amplifier (LNA), a frequency converter (Mixer), and an amplifier (AMP).

An operation of the millimeter-wave radar module will be simply described. Signal power of a millimeter-wave band frequency signal generated by the signal synthesizer IC 1 is amplified in the transmitter IC 2 and the signal is emitted as a radio wave to space by a transmission antenna 8. A signal reflected from a target is received as an electric signal by a reception antenna 9, the signals received by the receiver ICs 3 to 6 are amplified and are then processed in the BBIC 7, and information of the target is detected. The four receiver ICs 3 to 6 exist because the number of reception channels is increased to improve angle detection performance of a radar.

As described above, the reason why the module is configured using the plurality of ICs is to improve the versatility, such that a designer of the millimeter-wave radar module designs a system by combining any transmitter IC and any receiver IC. For this reason, the plurality of high frequency ICs is implemented inside of the millimeter-wave radar module. A millimeter-wave radar system is operated at a very high frequency band such as 24 GHz, 77 GHz, and 79 GHz. For this reason, an inspection cost at the time of an IC shipment has been a problem due to restriction such as construction of a test environment that can handle a millimeter-wave band, test precision because of using a high frequency probe or a high frequency socket, and a test time. Particularly, since a signal source of the millimeter-wave band is not incorporated in the transmitter IC and the receiver IC, a millimeter-wave band signal needs to be supplied from a measurer and a test cost further increases.

Technology for reducing a test cost in an inspection at the time of a shipment in an IC operated at a high frequency band is described in PTL 1. In PTL 1, an input impedance matching circuit having an inductor, a transistor amplifying an input signal having passed through the input impedance matching circuit, and a transistor for negative resistance capable of being turned on/off by a switch in the input impedance matching circuit are provided. In a test mode, the negative resistance is turned on and a test high frequency oscillator is configured and in a normal operation mode, the negative resistance is turned off and an operation of the oscillator is stopped. As a result, a high frequency characteristic of the IC can be guaranteed by providing a built-in test high frequency signal and only monitoring a direct-current characteristic.

CITATION LIST

Patent Literature

PTL 1: JP-2011-205280 A
NPL 1: supervision of translation by Kuroda (2002) "RF microelectronics" published by Maruzen, pp. 47-52

SUMMARY OF INVENTION

Technical Problem

However, in the circuit configuration according to PTL 1, since a test oscillator is positioned at a front step of a power amplifier and a transistor as a switch for operation switching or the like is provided in an input impedance matching circuit unit, power loss in a normal operation state increases. Particularly, at a millimeter-wave band frequency, even when the transistor is turned off, the transistor is coupled to a silicon substrate having large loss through a parasitic capacity of the transistor. For this reason, power loss further increases. Power loss of a matching input unit in an amplifier decreases a signal to noise ratio (SNR) that is noise performance, and deteriorates a quality of a signal, as described in page 47 of NPL 1. Particularly, when the technology according to PTL 1 is incorporated to the receiver, there is a problem in an influence that becomes significant.

The present invention has been made to solve the above problems and a representative object of the present invention is to provide an amplifier with a test oscillator for a high frequency characteristic monitor, which has small power loss in a normal operation state and secures good noise performance while it is possible to equip both a transmitter IC and a receiver IC with the amplifier.

Solution to Problem

An outline of a representative invention among inventions disclosed in the present application is described simply below.

In a high frequency IC including an amplifier including an inductive load and a test oscillator arranged in a same chip, the test oscillator commonly uses the inductive load of the amplifier, the amplifier has a bias voltage terminal to switch an operation state into an active state/inactive state, and the oscillator has a bias voltage terminal to switch an operation state into an active state/inactive state. In a test operation mode, the amplifier is inactivated and the test oscillator is activated and in a normal operation mode, the amplifier is activated and the test oscillator is inactivated.

Another aspect of the present invention is a high frequency IC or a circuit configuration that includes at least an inductive load, an amplifier, and an oscillator. The amplifier and the oscillator commonly use the inductive load. The amplifier has a first bias voltage terminal to switch an operation state of the amplifier into an active state/inactive state and the oscillator has a second bias voltage terminal to switch an operation state of the oscillator into an active state/inactive state. It is possible to perform control such that the amplifier is inactivated and the oscillator is activated in a first mode and the amplifier is activated and the oscillator is inactivated in a second mode. As a result, a product operation can be tested by the first mode, in a test at the time of a shipment.

Another aspect of the present invention is a high frequency IC or a circuit configuration that includes an inductive load, an amplifier, an oscillator, and a power sensor. The power sensor is connected to an output terminal of the amplifier, the inductive load is connected to a load side of the amplifier, and the inductive load is connected to an output side of the oscillator. The amplifier has a first bias voltage terminal to switch an operation state of the amplifier into an active state/inactive state and the oscillator has a second bias voltage terminal to switch an operation state of the oscillator into an active state/inactive state. It is possible to perform control such that the amplifier is inactivated and the oscillator is activated in a test operation mode and the amplifier is activated and the oscillator is inactivated in a normal operation mode.

Yet another aspect of the present invention is a wireless communication module equipped with a high frequency IC or a circuit. The high frequency IC has an inductive load, an amplifier, and a test oscillator and the amplifier and the test oscillator commonly use the inductive load connected to output sides of the amplifier and the test oscillator. The amplifier and the test oscillator can be controlled by a mode switching signal such that the amplifier is operated during a normal operation and the test transmitter is operated during a test.

In addition, another aspect of the present invention is a test method that uses the high frequency IC, the circuit configuration, or the wireless communication module described above, and inactivates an amplifier and activates an oscillator in a test operation to perform a test.

Advantageous Effects of Invention

An effect obtained by the representative invention among the inventions disclosed in the present application is described simply below.

That is, a representative effect is that a test cost can be reduced while a good noise characteristic is secured in a normal operation mode of a transmitter and a receiver.

DESCRIPTION OF EMBODIMENTS

Figure 1:
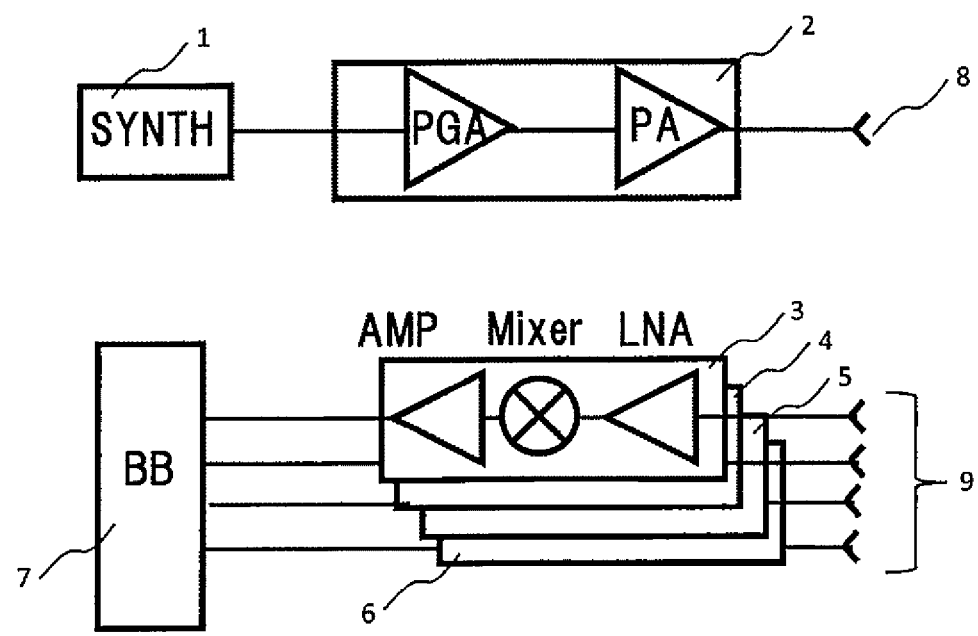
FIG. 1 is a block diagram illustrating a configuration example of a millimeter-wave radar module having a general multi-channel configuration.

In embodiments described below, the invention will be described in a plurality of embodiments or sections when required as a matter of convenience. However, these sections or embodiments are not irrelevant to each other unless otherwise stated and one relates to a modification, details, supplementary description or the like of the entire or part of the other. In addition, in the embodiments described below, when the number of elements (including the number of pieces, values, amounts, ranges, and the like) is mentioned, the number of the elements is not limited to a specific number unless otherwise stated or except for the case in which the number is apparently limited to a specific number in principle, and the number larger or smaller than the specified number is also applicable.

In the embodiments described below, it goes without saying that components in the embodiments (also including element steps and the like) are not always indispensable unless otherwise stated or except for the case in which the components are considered to be apparently indispensable in principle. Similarly, in the embodiments described below, when shapes of the components, a positional relation thereof, and the like are mentioned, the substantially approximate or similar shapes and the like are included therein unless otherwise stated or except for the case in which it is considered that they are not apparently included in principle. The same applies to the numerical values and the ranges described above.

The embodiments will be described in detail using the drawings. However, the present invention should not be understood to be limited to contents described in the embodiments illustrated below. It should be understood easily by those skilled in the art that a specific configuration of the present invention can be changed without departing from the spirit or gist of the present invention.

In a configuration of the invention described below, the same parts or parts having the same functions are denoted by the same reference numerals throughout the different drawings and redundant description may be omitted.

In the present specification and the like, notations such as "first," "second," and "third" are given to identify components and do not necessarily limit the number or order. In addition, numbers to identify the components are used for each context and numbers used in one context do not necessarily indicate the same configurations in another context. In addition, a component identified by a certain number may have a function of a component identified by another number.

Positions, sizes, shapes, and ranges of individual configurations illustrated in the drawings and the like may not represent actual positions, sizes, shapes, and ranges in order to facilitate understanding of the invention. For this reason, the present invention is not necessarily limited to the positions, the sizes, the shapes, and the ranges disclosed in the drawings and the like.

First Embodiment

A high frequency IC according to a first embodiment will be described on the basis of FIGS. 2 to 4.

Figure 2:
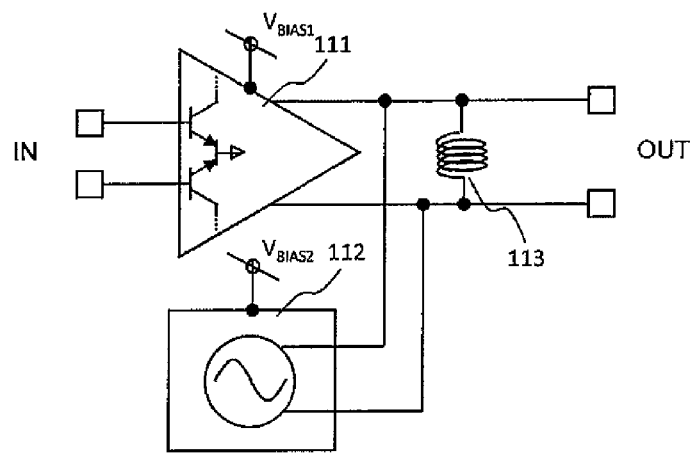
FIG. 2 is a circuit diagram illustrating a basic configuration of the present invention.

As illustrated in FIG. 2, the high frequency IC according to the first embodiment is a high frequency IC that includes a differential amplifier 111 having an inductive load 113 and a test oscillator 112. The test oscillator 112 commonly uses the inductive load 113 of the amplifier 111. As a connection relation, both ends of the inductive load 113 are connected to an output of the differential amplifier 111 and are connected to an output of the test transmitter 112.

The differential amplifier 111 has a bias voltage terminal VBIAS1 to switch an operation state into an active state/inactive state and the oscillator 112 has a bias voltage terminal VBIAS2 to switch an operation state into an active state/inactive state. As described above, in the high frequency IC, in a test operation mode, the amplifier 111 is inactivated and the test oscillator 112 is activated and in a normal operation mode, the amplifier 111 is activated and the test oscillator 112 is inactivated.

The inductive load 113 connected to the differential amplifier 111 is connected to a side opposite to an input of the differential amplifier 111, as illustrated in FIG. 2. The inductive load 113 can be used for various purposes such as filtering of an output signal, attenuation of noise from a power supply, output impedance matching, provision of impedance in a high band, and improvement of gain. In this embodiment, since the inductive load 113 is also used for an operation of the test transmitter 112, it is possible to avoid increase in a cost and area of individually providing an inductor for the transmitter.

The differential amplifier 111 and the test oscillator 112 configuring the high frequency IC according to the first embodiment will be described in detail using FIG. 3. Note that in FIG. 3, all transistors are configured with bipolar transistors for the sake of convenience; however, the transistors configured with other transistors such as MOSFETs have the same effects.

The differential amplifier 111 includes transistors 1111 and 1112 and resistive elements 1113, 1114, and 1115. A base terminal of the transistor 1111 is connected to an input terminal INP of the high frequency IC and the resistor 1114 and a base terminal of the transistor 1112 is connected to an input terminal INN of the high frequency IC and the resistor 1115. Emitter terminals of the transistors 1112 and 1113 are connected to a GND through the resistor 1113. A collector terminal of the transistor 1111 is connected to a terminal 1131 of an inductor 113, a capacitor 114, and an output terminal OUTP and a collector terminal of the transistor 1112 is connected to a terminal 1132 of the inductor 113, a capacitor 115, and an output terminal OUTN. The bias voltage terminal VBIAS1 is connected to the base terminals of the transistors 1111 and 1112 through the resistors 1114 and 1115, in order not to affect a high frequency characteristic.

Meanwhile, the test oscillator 112 includes transistors 1121 and 1122, capacitors 1124 and 1125, and resistors 1123, 1126, and 1127. A collector terminal of the transistor 1121 is connected to a base terminal of the transistor 1122 through the capacitor 1124 and at the same time a collector terminal of the transistor 1122 is connected to a base terminal of the transistor 1121 through the capacitor 1125 to form a positive feedback loop.

In addition, the collector terminal of the transistor 1121 is connected to the terminal 1131 of the inductor 113, the capacitor 114, and the output terminal OUTP and the collector terminal of the transistor 1122 is connected to the terminal 1132 of the inductor 113, the capacitor 115, and the output terminal OUTN. The emitter terminals of the transistors 1112 and 1113 are connected to the GND through the resistor 1113. The bias voltage terminal VBIAS1 is connected to the base terminals of the transistors 1111 and 1112 through the resistors 1114 and 1115, in order not to affect a high frequency characteristic. A middle point 1133 of the inductor 113 is connected to a power supply terminal VCC and supplies power to the differential amplifier 111 and the test oscillator 112.

Figure 3:
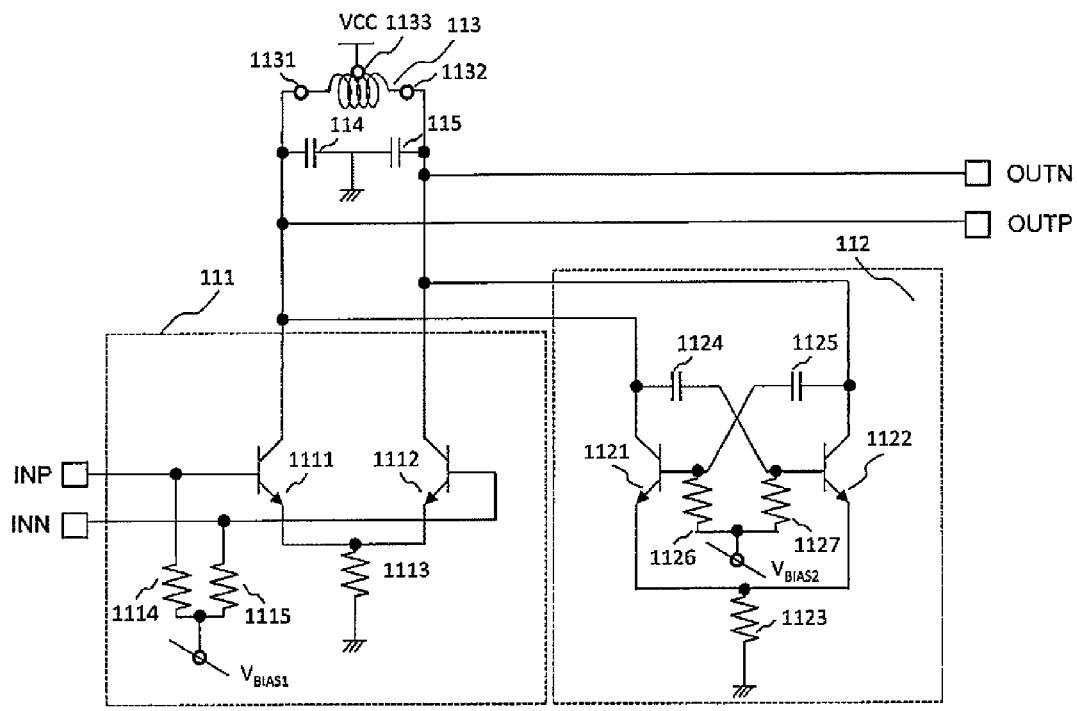
FIG. 3 is a circuit diagram illustrating a configuration of a high frequency IC according to a first embodiment of the present invention.

As such, an example of FIG. 3 has a configuration in which the collectors of the transistors 111 and 112 configuring the differential amplifier 111 are connected to the terminals of the inductor 113 and an output of the test transmitter 112 is connected between the terminals of the inductor 113 and the collectors of the transistors.

Next, a circuit operation in the first embodiment will be described. The high frequency IC according to this embodiment has at least two operation modes. A first operation mode is a normal operation mode in which a high frequency signal input from the outside of the high frequency IC is amplified and then is output to the outside. A second operation mode is a test operation mode in which, at the time of a shipment test of the high frequency IC, a high frequency signal is generated from the test oscillator implemented inside of the high frequency IC according to the present invention, and a signal level and a frequency of the generated signal are confirmed to confirm whether the circuit is normally operated.

In the first normal operation mode, a bias voltage of the bias voltage terminal VBIAS2 is decreased to a GND level and the test oscillator is turned off. Meanwhile, a direct-current voltage value at which the differential amplifier 112 is normally operated is applied as a bias voltage of the bias voltage terminal VBIAS1 and the differential amplifier is turned on. As a result, the high frequency IC can amplify the external input signal described above and output the external input signal to the outside.

In the second test operation mode, the bias voltage of the bias voltage terminal VBIAS1 is decreased to the GND level and the differential amplifier is turned off. Meanwhile, a direct-current voltage value at which the test oscillator 112 is normally operated is applied as the bias voltage of the bias voltage terminal VBIAS2 and the test oscillator is turned on. As a result, the test oscillator outputs an oscillation signal at a resonance frequency determined by parasitic capacities such as the inductor 113, the capacitors 114 and 115, and the transistors.

In the circuit configurations of FIGS. 2 and 3, since the test oscillator 112 is arranged on a rear step of the differential amplifier 111, it is possible to make use of advantages in terms of power loss and a noise characteristic, as compared with the case in which the test oscillator is arranged on a front step of the differential amplifier 111.

Figure 4:
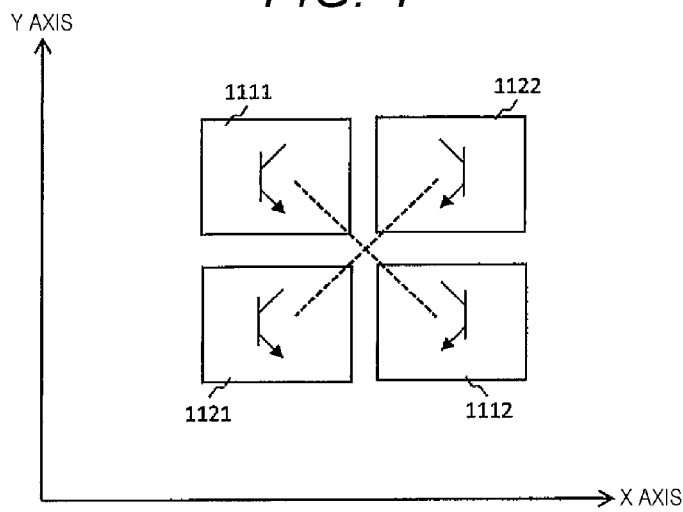
FIG. 4 is a plan view illustrating an example of a transistor element arrangement of a test oscillator and an amplifier according to the first embodiment of the present invention.

FIG. 4 schematically illustrates an arrangement in a chip layout of the transistors 1111 and 1112 configuring the differential amplifier 111 and the transistors 1121 and 1122 configuring the test oscillator 112 in the first embodiment. In the high frequency IC according to this embodiment, the transistors 1111 and 1112 of the differential amplifier 111 and the transistors 1121 and 1122 of the test oscillator 112 preferably have the same current driving ability. For this reason, as illustrated in FIG. 4, the transistors 1111, 1112, 1121, and 1122 are arranged in a common centroidal manner, so that characteristics of the transistors can be almost matched with each other.

According to this embodiment, in the high frequency IC, the test oscillator 112 can be arranged on a load side of the differential amplifier 111. As compared with the case in which the oscillator is arranged on the front step of the differential amplifier, as in PTL 1, loss of power input to the differential amplifier 111 is suppressed, and good noise performance can be secured in the normal operation mode. Moreover, a built-in high frequency signal source for a test is provided to make an externally attached expensive high frequency signal source unnecessary, so that a test cost at the time of an IC shipment can be suppressed. In addition, the transistors are arranged as illustrated in FIG. 4, so that the transistors 1111, 1112, 1121, and 1122 of the differential amplifier 111 and the test oscillator 112 have almost the same performance. Therefore, monitoring a signal level of an output signal of the test oscillator 112 in the test mode becomes equivalent to viewing performance of the differential amplifier 111.

As such, in this embodiment, the high frequency IC can be shipped with the high frequency characteristic of the high frequency IC guaranteed by carrying out only a direct-current operation test while securing good noise performance in the normal operation mode of the transmitter and the receiver, so that the test cost can be reduced.

Second Embodiment

Figure 5:
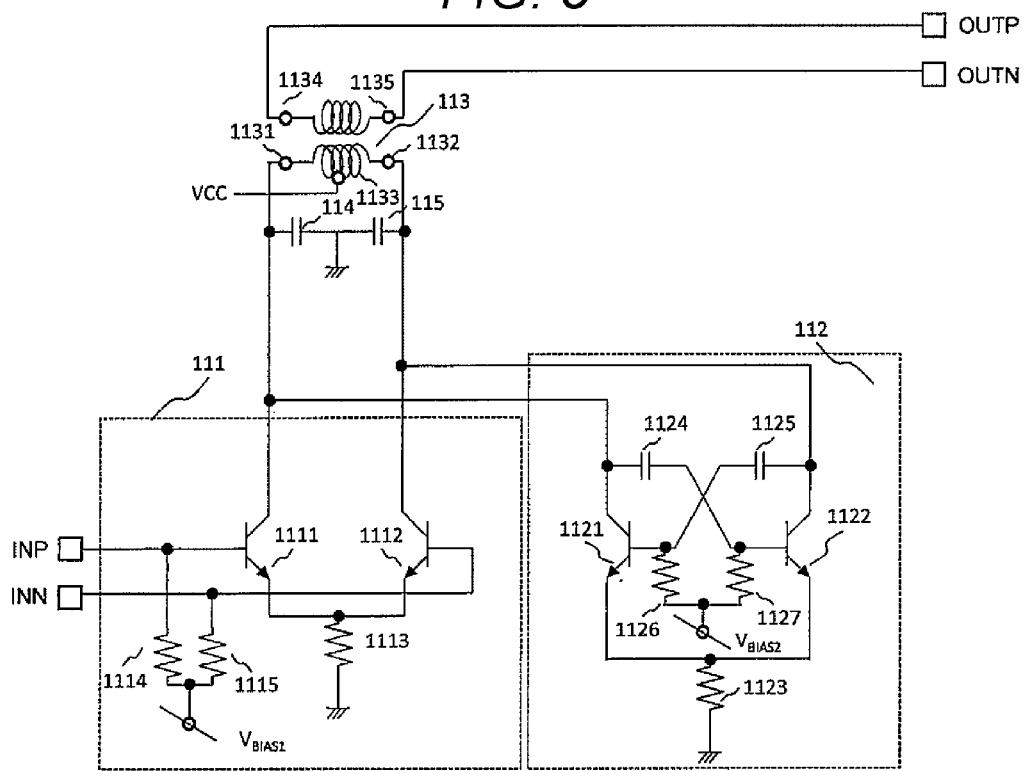
FIG. 5 is a circuit diagram illustrating a configuration of a high frequency IC according to a second embodiment of the present invention.

A high frequency IC according to a second embodiment will be described on the basis of FIG. 5.

The second embodiment is a modification of the high frequency IC according to the first embodiment. In the second embodiment, an inductor 113 is configured using a transformer. A primary side of the transformer is connected to a differential amplifier 111 and a test oscillator 112 and a secondary side is connected to output terminals OUTP and OUTN of the high frequency IC. Since the other circuit configuration and circuit operation and a common centroidal arrangement of transistors are the same as those in the first embodiment, repetitive description is omitted.

According to this embodiment, a transformer output is taken while securing of good noise performance and reduction of a test cost at the time of an IC shipment are realized in a similar manner to the first embodiment. Therefore, there is an effect of facilitating impedance matching with an amplifier arranged on a rear step.

Third Embodiment

Figure 6:
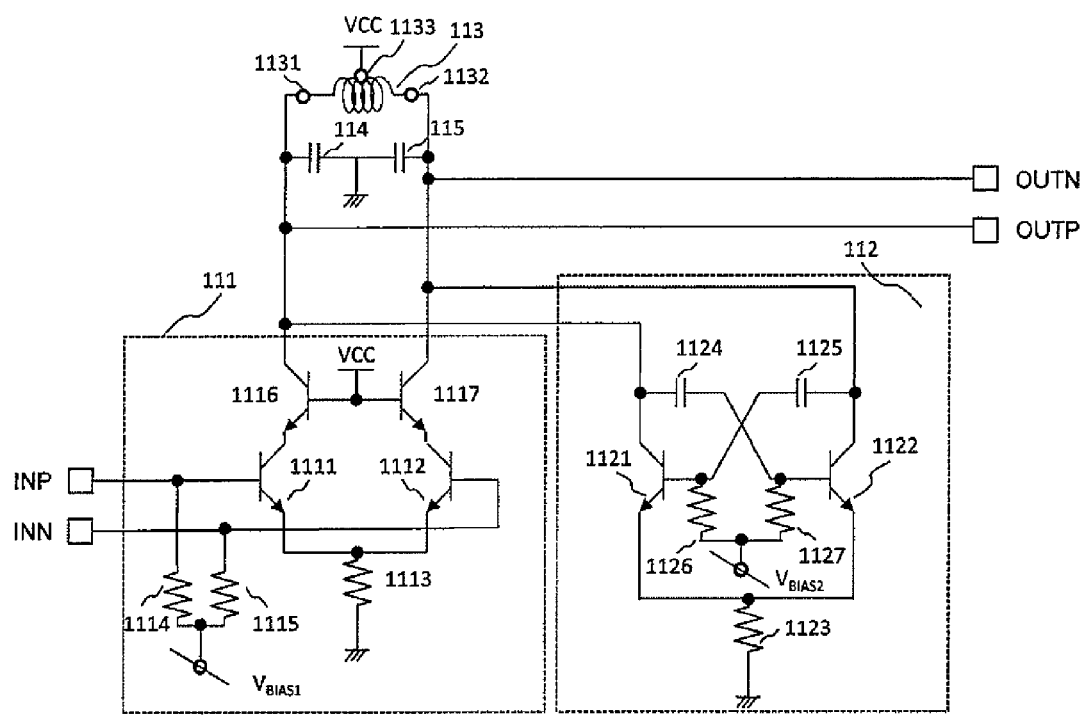
FIG. 6 is a circuit diagram illustrating a configuration of a high frequency IC according to a third embodiment of the present invention.

A high frequency IC according to a third embodiment will be described on the basis of FIG. 6.

The third embodiment is a modification of the high frequency IC according to the first embodiment. In the third embodiment, a differential amplifier 111 is a cascode amplifier. Hereinafter, a circuit configuration of the differential amplifier 111 will be described.

The differential amplifier 111 includes transistors 1111, 1112, 1116, and 1117 and resistive elements 1113, 1114, and 1115. A base terminal of the transistor 1111 is connected to an input terminal INP of the high frequency IC and the resistor 1114 and a base terminal of the transistor 1112 is connected to an input terminal INN of the high frequency IC and the resistor 1115. Emitter terminals of the transistors 1112 and 1113 are connected to a GND through the resistor 1113. A collector terminal of the transistor 1111 is connected to an emitter terminal of the transistor 1116 and a collector terminal of the transistor 1112 is connected to an emitter terminal of the transistor 1117. Base terminals of the transistors 1116 and 1117 are connected to a power supply terminal. A collector terminal of the transistor 1116 is connected to a terminal 1131 of an inductor 113, a capacitor 114, and an output terminal OUTP and a collector terminal of the transistor 1117 is connected to a terminal 1132 of the inductor 113, a capacitor 115, and an output terminal OUTN. A bias voltage terminal VBIAS1 is connected to the base terminals of the transistors 1111 and 1112 through the resistors 1114 and 1115, in order not to affect a high frequency characteristic. Meanwhile, since a test oscillator 112 and the inductor 113 have the same circuit configurations as those in the first embodiment, description thereof is omitted. In addition, since two operation modes and operation principles thereof are also the same, repetitive description is omitted.

According to this embodiment, the cascode configuration is adopted while securing of good noise performance and reduction of a test cost at the time of an IC shipment are realized in a similar manner to the first embodiment, so that an isolation characteristic between an input and an output is secured and an influence by a mirror effect can be reduced. Therefore, an operation frequency band can be extended.

Fourth Embodiment

Figure 7:
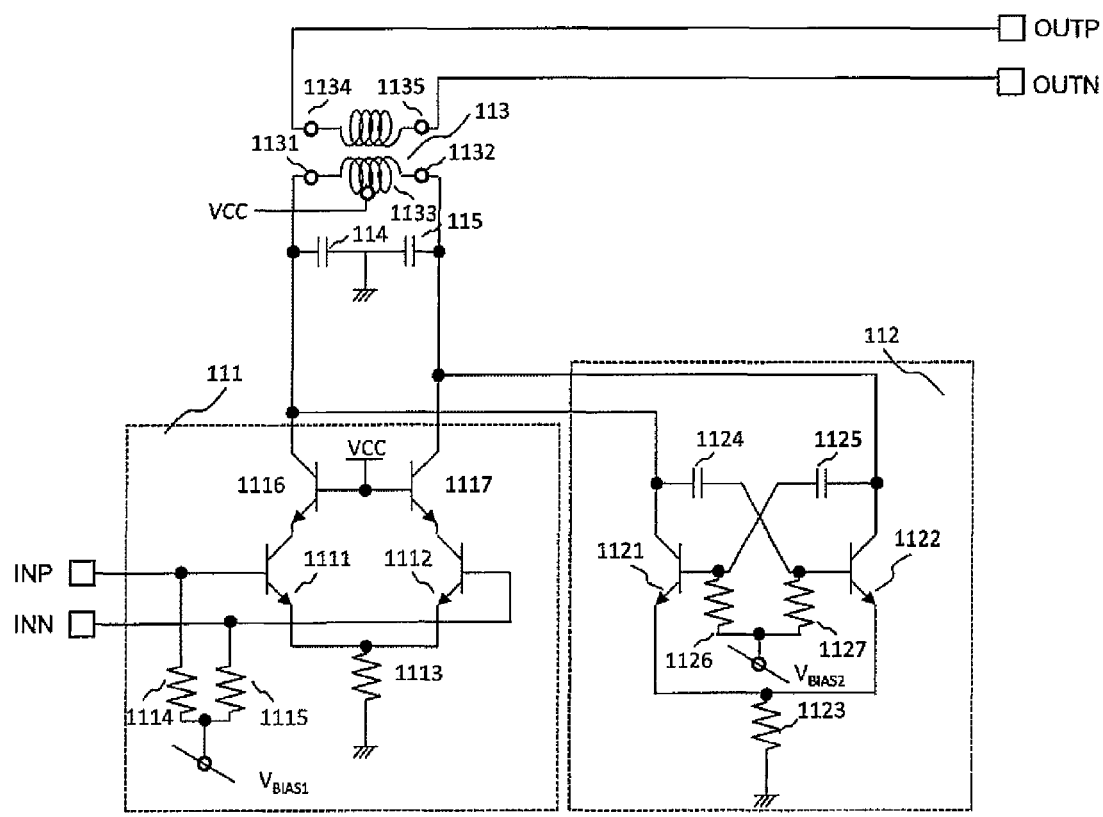
FIG. 7 is a circuit diagram illustrating a configuration of a high frequency IC according to a fourth embodiment of the present invention.

A high frequency IC according to a fourth embodiment will be described on the basis of FIG. 7.

The fourth embodiment is a high frequency IC obtained by combining the configuration of the output unit using the transformer 113 illustrated in the second embodiment and the cascode configuration illustrated in the third embodiment. Since a circuit configuration and an operation principle are the same as those in the first to third embodiments, repetitive description is omitted.

According to this embodiment, a transformer output is taken while securing of good noise performance and reduction of a test cost at the time of an IC shipment are realized in a similar manner to the first embodiment, so that there is an effect of facilitating impedance matching with an amplifier arranged on a rear step. Moreover, since the cascode configuration is adopted, an isolation characteristic between an input and an output is secured and an influence by a mirror effect can be reduced. Therefore, an operation frequency band can be extended.

Fifth Embodiment

Figure 8:
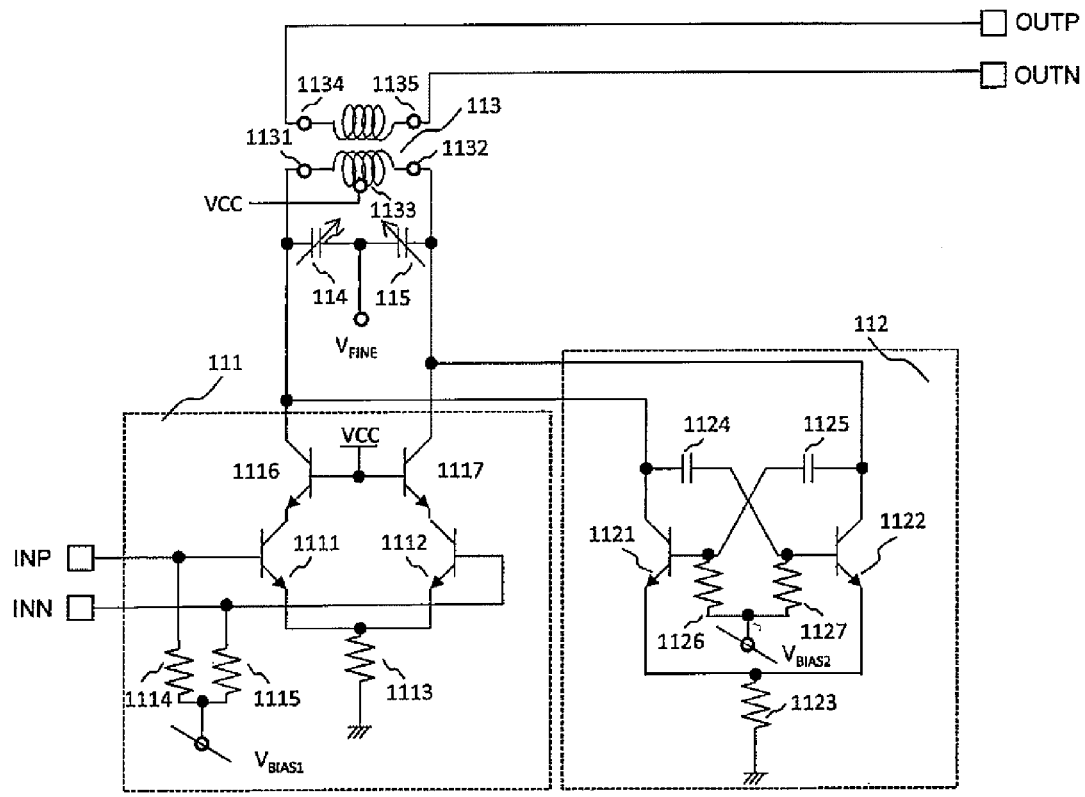
FIG. 8 is a circuit diagram illustrating a configuration of a high frequency IC according to a fifth embodiment of the present invention.

A high frequency IC according to a fifth embodiment will be described on the basis of FIG. 8.

In the fifth embodiment, capacitors 114 and 115 in the high frequency IC according to the fourth embodiment are varactors. The varactors 114 and 115 are capacitors in which capacity values can be varied by a control voltage VFINE.

Figure 9:
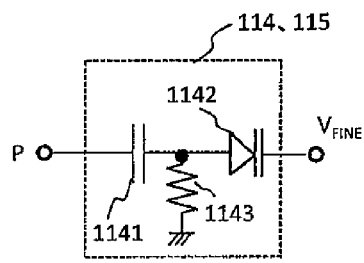
FIG. 9 is a circuit diagram illustrating a configuration of a varactor configuring the high frequency IC according to the fifth embodiment of the present invention.

FIG. 9 is a diagram illustrating a configuration example of the varactor. Each of the varactors 114 and 115 includes a capacitor 1141, a varactor diode, and a resistor 1143. The capacitor 1141 is inserted to separate a direct-current voltage of an anode of the varactor diode from a direct-current voltage of a differential amplifier 111 and a test oscillator, and the resistor 1143 is inserted to fix a potential of the anode of a varactor diode 1142 to a GND potential while separating a high frequency signal. Here, when a voltage value of the control voltage terminal VFINE connected to a cathode of the varactor diode 1142 is increased, a depletion layer of a PN junction of the varactor diode is expanded and a capacity value decreases. That is, the circuit configuration of FIG. 8 makes it possible to vary the capacities of the varactors 114 and 115 by the control voltage VFINE. Since the other circuit configurations and operation principles of the differential amplifier 111 and the test oscillator are the same as those in the first to fourth embodiments, repetitive description is omitted.

According to this embodiment, since an oscillation frequency of the test oscillator in a test operation mode can be varied, a test of frequency dependency of output power of a transmitter chain or the like can be carried out at a low cost, for example in a transmitter IC according to an eighth embodiment to be described below.

Sixth Embodiment

Figure 10:
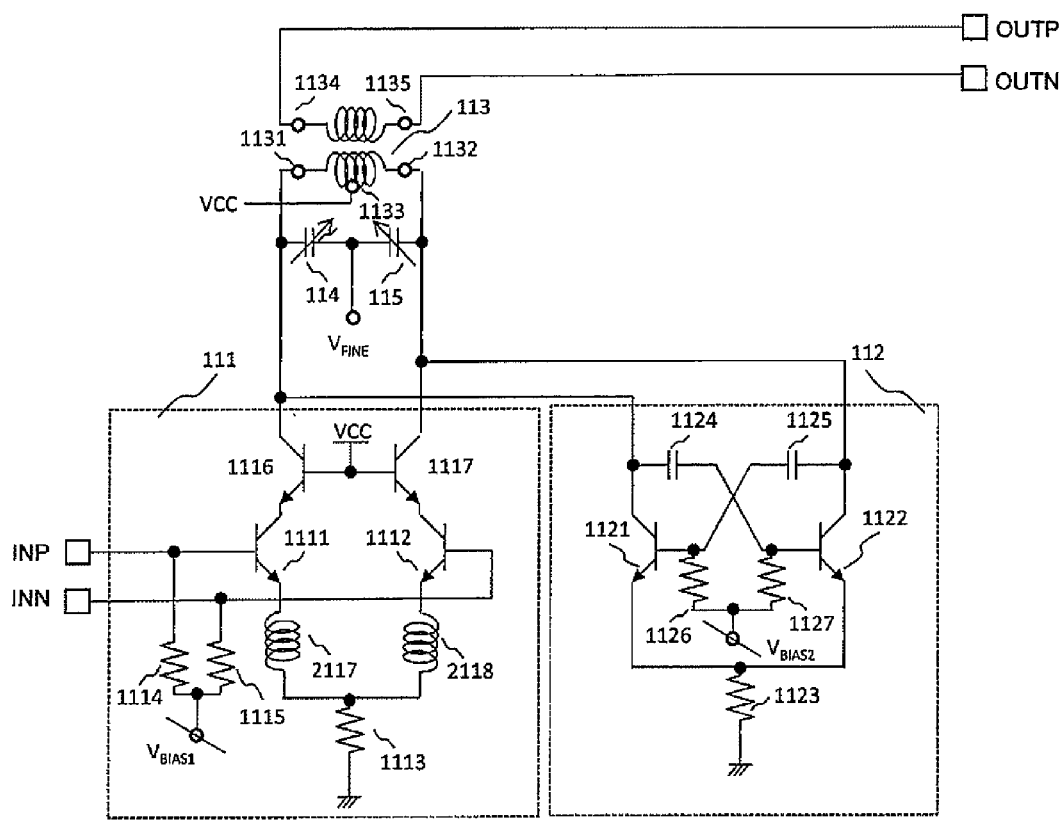
FIG. 10 is a circuit diagram illustrating a configuration of a high frequency IC according to a sixth embodiment of the present invention.

A high frequency IC according to a sixth embodiment will be described on the basis of FIG. 10.

In the sixth embodiment, a differential amplifier 111 in the high frequency IC according to the fifth embodiment is an emitter degenerative amplifier using an inductor 2117. Hereinafter, a circuit configuration of the differential amplifier 111 according to this embodiment will be described. The differential amplifier 111 includes transistors 1111, 1112, 1116, and 1117, resistive elements 1113, 1114, and 1115, and inductors 2218 and 2117. A base terminal of the transistor 1111 is connected to an input terminal INP of the high frequency IC and the resistor 1114 and a base terminal of the transistor 1112 is connected to an input terminal INN of the high frequency IC and the resistor 1115. An emitter terminal of the transistor 1112 is connected to a GND through the inductor 2117 and the resistor 1113 and the transistor 1113 is connected to the GND through the inductor 2118 and the resistor 1113. A collector terminal of the transistor 1111 is connected to an emitter terminal of the transistor 1116 and a collector terminal of the transistor 1112 is connected to an emitter terminal of the transistor 1117. Base terminals of the transistors 1116 and 1117 are connected to a power supply terminal. A collector terminal of the transistor 1116 is connected to a terminal 1131 of an inductor 113, a capacitor 114, and an output terminal OUTP and a collector terminal of the transistor 1117 is connected to a terminal 1132 of the inductor 113, a capacitor 115, and an output terminal OUTN. A bias voltage terminal VBIAS1 is connected to the base terminals of the transistors 1111 and 1112 through the resistors 1114 and 1115, in order not to affect a high frequency characteristic. Meanwhile, since a test oscillator 112 and the inductor 113 have the same circuit configurations as those in the fifth embodiment, description thereof is omitted.

According to this embodiment, since the inductor is connected to the emitter terminal of the differential amplifier 111, power matching and noise matching can be achieved at the same time. Therefore, noise performance can be improved as compared with the high frequency ICs according to the first to fifth embodiments. When this embodiment is used in a receiver IC according to a ninth embodiment to be described below, a particularly high effect is obtained.

Seventh Embodiment

A high frequency IC according to a seventh embodiment will be described on the basis of FIG. 11.

In the seventh embodiment, a power sensor 140 is included in output terminals OUTP and OUTN in the high frequency IC according to each of the first to sixth embodiments. The power sensor 140 is a circuit block that detects a high frequency signal output from a differential amplifier 111 and a test oscillator 112 to output a direct-current voltage or a direct current proportional to an output signal level thereof. Hereinafter, a detailed operation in the seventh embodiment will be described.

Figure 11:
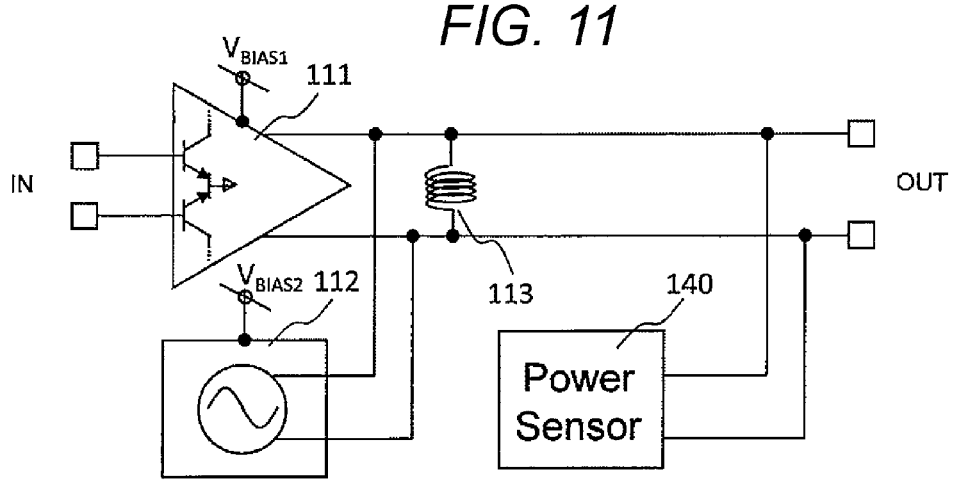
FIG. 11 is a block diagram illustrating a configuration of a high frequency IC according to a seventh embodiment of the present invention.

The high frequency IC according to the seventh embodiment is a high frequency IC that includes at least the differential amplifier 111 having an inductive load 113, the test oscillator 112, and the power sensor 140, as illustrated in FIG. 11. The test oscillator 112 commonly uses the inductive load 113 of the amplifier 111, the amplifier 111 has a bias voltage terminal VBIAS1 to switch an operation state into an active state/inactive state, and the oscillator 112 has a bias voltage terminal VBIAS2 to switch an operation state into an active state/inactive state.

As described above, in the high frequency IC, in a test operation mode, the amplifier 111 is inactivated and the test oscillator 112 is activated and in a normal operation mode, the amplifier 111 is activated and the test oscillator 112 is inactivated.

The high frequency IC according to this embodiment has at least two operation modes. A first operation mode is a normal operation mode in which a high frequency signal input from the outside of the high frequency IC is amplified and then is output to the outside. A second operation mode is a test operation mode in which, at the time of a shipment test of the high frequency IC, a high frequency signal is generated from the test oscillator implemented inside of the high frequency IC according to this embodiment, the generated high frequency signal is converted into a direct-current voltage or a direct-current voltage according to a signal level of the high frequency signal by the power sensor 140, and a direct-current voltage value thereof is monitored to confirm whether the circuit is normally operated.

In the first normal operation mode, a bias voltage of the bias voltage terminal VBIAS2 is decreased to a GND level and the test oscillator is turned off. Meanwhile, a direct-current voltage value at which the differential amplifier 112 is normally operated is applied as a bias voltage of the bias voltage terminal VBIAS1 and the differential amplifier is turned on. As a result, the high frequency IC can amplify the external input signal described above and output the external input signal to the outside.

In the second test operation mode, the bias voltage of the bias voltage terminal VBIAS1 is decreased to the GND level and the differential amplifier is turned off. Meanwhile, a direct-current voltage value at which the test oscillator 112 is normally operated is applied as the bias voltage of the bias voltage terminal VBIAS2 and the test oscillator is turned on. As a result, the test oscillator 112 outputs an oscillation signal at a resonance frequency determined by parasitic capacities such as the inductor 113, the capacitors 114 and 115, and the transistors. The high frequency signal generated by the test oscillator 112 is input to the power sensor 140 and is converted into a direct-current voltage or a direct current according to a signal level of the high frequency signal and a direct-current voltage value or a direct current value thereof is monitored.

According to this embodiment, in the test operation mode at the time of the IC shipment, the signal level of the high frequency signal generated by the test oscillator 112 can be converted into the direct-current voltage by the power sensor 140. Therefore, since a high frequency measurer can be removed completely from a test environment, a test cost can be reduced further as compared with the first to sixth embodiments.

Eight Embodiment

A transmitter IC according to an eighth embodiment will be described on the basis of FIGS. 12 and 13.

Figure 12:
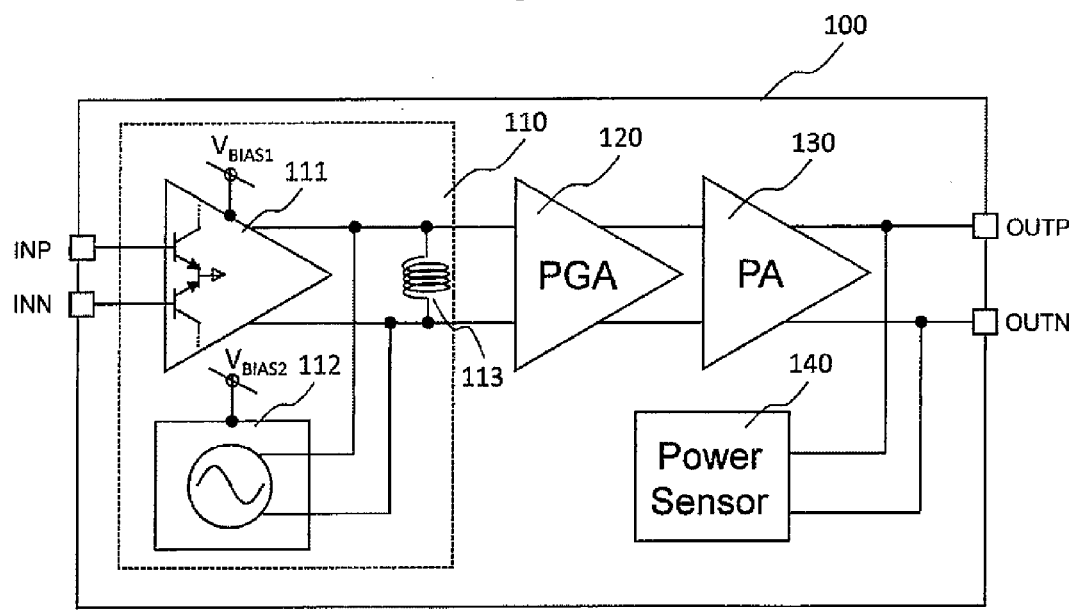
FIG. 12 is a block diagram illustrating a configuration of a transmitter IC according to an eighth embodiment of the present invention.

FIG. 12 is a diagram illustrating a circuit configuration of a transmitter IC 100 according to the eighth embodiment. In the eighth embodiment, a programmable gain amplifier (PGA) 120, a power amplifier (PA) 130, and a power sensor 140 are connected to a rear step of the high frequency IC illustrated in each of the first to sixth embodiments. Here, since the high frequency IC illustrated in each of the first to sixth embodiments serves as a block in an IC, the high frequency IC is defined as a differential amplifier 110 with a test oscillator in this embodiment and the following embodiments.

The transmitter IC according to the eighth embodiment includes at least the differential amplifier 110 with the test oscillator that is illustrated in each of the first to sixth embodiments, the PGA 120 that can control circuit gain arbitrarily, the PA 130 that outputs power to drive a transmission antenna outside the IC, and the power sensor 140 that outputs a direct-current voltage or a direct current proportional to an output signal level of a high frequency output signal of the PA 130. Input terminals INP and INN of the transmitter IC are connected to the differential amplifier 110 with the test oscillator, an output of the differential amplifier 110 with the test oscillator is connected to the PGA 120, an output of the PGA 120 is connected to the PA 130, and an output of the PA 130 is connected to the power sensor 140 and output terminals OUTP and OUTN of the transmitter IC.

Next, a circuit operation in the eighth embodiment will be described. The transmitter IC 100 according to this embodiment has at least two operation modes in a similar manner to the first to seventh embodiments. A first operation mode is a normal operation mode in which a high frequency signal input from the outside of the transmitter IC 100 is amplified and then is output to the outside. A second operation mode is a test operation mode in which, at the time of a shipment test of the transmitter IC 100, a high frequency signal is generated from a test oscillator 112 in the differential amplifier 110 with the test oscillator implemented inside of the transmitter IC 100 according to the present invention, and a signal level and a frequency of the generated signal are confirmed to confirm whether the circuit is normally operated.

In the first normal operation mode, a bias voltage of the bias voltage terminal VBIAS2 described in the first embodiment is decreased to a GND level and the test oscillator 112 is turned off. Meanwhile, a direct-current voltage value at which the differential amplifier 111 is normally operated is applied as a bias voltage of the bias voltage terminal VBIAS1 described in the first embodiment and the differential amplifier is turned on. As a result, the transmitter IC can amplify an external input signal passing through a transmission chain connected to the differential amplifier 111, the PGA 120, and the PA 130 and output the external input signal to the outside of the transmitter IC 100.

In the second test operation mode, the bias voltage of the bias voltage terminal VBIAS1 is decreased to the GND level and the differential amplifier 111 is turned off. Meanwhile, a direct-current voltage value at which the test oscillator 112 is normally operated is applied as the bias voltage of the bias voltage terminal VBIAS2 and the test oscillator is turned on. As a result, the test oscillator 112 outputs an oscillation signal at a resonance frequency determined by parasitic capacities such as an inductor 113, capacitors 114 and 115, and transistors. The high frequency signal generated by the test oscillator 112 is amplified by the PGA 120 and the PA 130, is then input to the power sensor 140, and is converted into a direct-current voltage or a direct current according to a signal level of the high frequency signal and a direct-current voltage value or a direct current value thereof is monitored.

Note that in FIG. 12, the differential amplifier 110 with the test oscillator, the PGA 120, the PA 130, and the power sensor 140 are configured as one system; however, a plurality of sets of these elements can be included to realize a multi-channel configuration. The plurality of sets may be arranged on the same chip or different chips.

Figure 13:
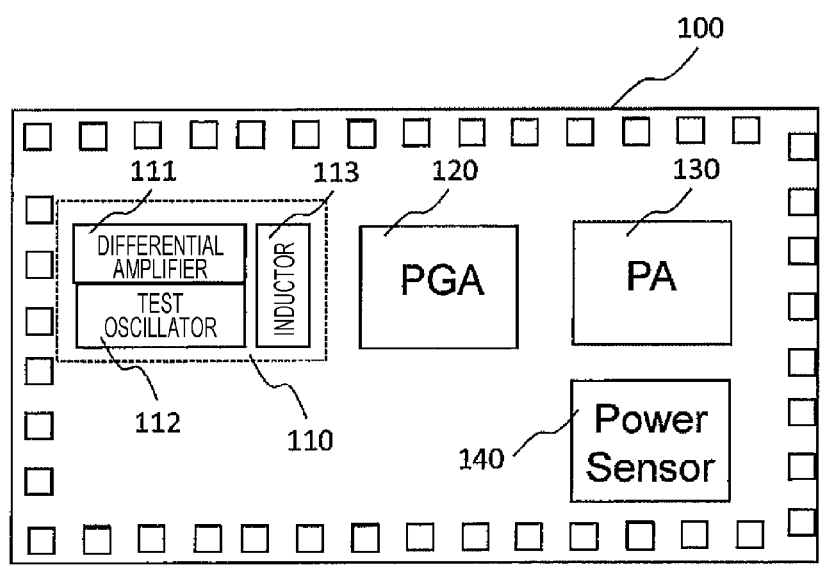
FIG. 13 is a plan view illustrating a block arrangement on a circuit layout of a transmitter IC according to a ninth embodiment of the present invention.

FIG. 13 is a schematic diagram illustrating an arrangement of individual blocks on a chip layout of the transmitter IC 100 according to the eighth embodiment. As described in the first embodiment, transistors of the differential amplifier 111 and the test oscillator 112 in the differential amplifier 110 with the test oscillator preferably have the same current driving ability in terms of securing precision at the time of the IC shipment test. For this reason, in the layout arrangement of the differential amplifier 111 and the test oscillator 112, the differential amplifier and the test oscillator are preferably close to each other, as illustrated in FIG. 13. In addition, when the transistors of the differential amplifier 111 and the test oscillator 112 are arranged in the common centroidal manner illustrated in FIG. 4, test precision can be further improved.

According to this embodiment, in the transmitter IC 100, good noise performance can be secured in the normal operation mode and a built-in high frequency signal source for a test is provided to make an externally attached expensive high frequency signal source unnecessary, so that a test cost at the time of an IC shipment can be suppressed. Note that in the eighth embodiment, by using the differential amplifier 110 with the test oscillator described in the seventh embodiment, in a test at the time of the IC shipment, a test of frequency dependency of an output voltage output by the transmitter IC 100 is also enabled by swinging the VFINE voltage and a shipment yield of the transmitter IC is improved, so that a cost can be further reduced.

Ninth Embodiment

A receiver IC according to a ninth embodiment will be described on the basis of FIGS. 14 and 15.

Figure 14:
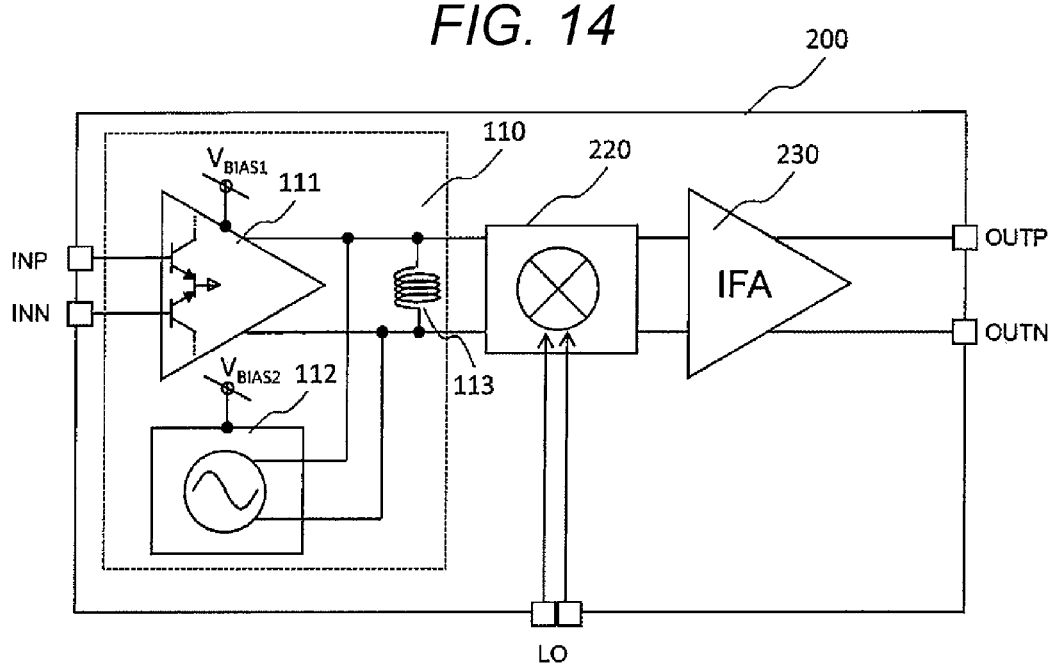
FIG. 14 is a block diagram illustrating a configuration of a transmitter IC according to a tenth embodiment of the present invention.

FIG. 14 is a diagram illustrating a circuit configuration of a receiver IC 200 according to the ninth embodiment. The ninth embodiment is the receiver IC 200 in which a mixer (frequency converter) (MIX) 220 and an intermediate frequency amplifier (IFA) 230 are connected to a rear step of the differential amplifier 110 with the test oscillator illustrated in each of the first to sixth embodiments.

The receiver IC according to the ninth embodiment includes at least the differential amplifier 110 with the test oscillator illustrated in each of the first to sixth embodiments, the MIX 220 that mixes an output signal of the differential amplifier 110 with the test oscillator and a local signal of a high frequency supplied from the outside of the receiver IC, performs frequency conversion, and generates an intermediate frequency signal, and the IFA 230 that amplifies the intermediate frequency signal generated by the MIX 220 to an appropriate signal level. Input terminals INP and INN of the receiver IC 200 are connected to the differential amplifier 110 with the test oscillator, an output of the differential amplifier 110 with the test oscillator and a local signal terminal LO of the receiver IC are connected to the MIX 220, an output of the MIX 220 is connected to the IFA 230, and an output of the IFA 230 is connected to output terminals OUTP and OUTN of the receiver IC 200.

Next, a circuit operation in the ninth embodiment will be described. The receiver IC 200 according to this embodiment has at least two operation modes in a similar manner to the first to eighth embodiments. A first operation mode is a normal operation mode in which a high frequency signal input from the outside of the receiver IC 200 is amplified, the high frequency signal is then down-converted into an intermediate frequency by the MIX 200, and an intermediate frequency band signal amplified by the IFA 230 is output to the outside. A second operation mode is a test operation mode in which, at the time of a shipment test of the receiver IC 200, a high frequency signal is generated from a test oscillator 112 in the differential amplifier 110 with the test oscillator implemented inside of the receiver IC 200 according to the present invention, and a signal level of an intermediate frequency band signal down-converted into an intermediate frequency band by the MIX 220 is confirmed to confirm whether the circuit is normally operated.

In the first normal operation mode, a bias voltage of the bias voltage terminal VBIAS2 described in the first embodiment is decreased to a GND level and the test oscillator 112 is turned off. Meanwhile, a direct-current voltage value at which a differential amplifier 111 is normally operated is applied as a bias voltage of the bias voltage terminal VBIAS1 described in the first embodiment and the differential amplifier is turned on. As a result, the receiver IC 200 can amplify an external input signal passing through a reception chain connected to the differential amplifier 111, the MIX 220, and the IFA 230 and output the external input signal to the outside of the receiver IC 200.

In the second test operation mode, the bias voltage of the bias voltage terminal VBIAS1 is decreased to the GND level and the differential amplifier 111 is turned off. Meanwhile, a direct-current voltage value at which the test oscillator 112 is normally operated is applied as the bias voltage of the bias voltage terminal VBIAS2 and the test oscillator is turned on. As a result, the test oscillator 112 outputs an oscillation signal at a resonance frequency determined by parasitic capacities such as an inductor 113, capacitors 114 and 115, and transistors. The high frequency signal generated by the test oscillator 112 is down-converted into an intermediate frequency band signal by the MIX 220 and is amplified by the IFA 230 and then a signal level of the intermediate frequency band signal in the output terminals OUTP and OUTN of the receiver IC 200 is monitored. Since a frequency of the above-described intermediate frequency band signal is sufficiently low as compared with a frequency of the high frequency signal generated by the above-described test oscillator 112, a signal level thereof can be measured without requiring an expensive measurer.

Note that in FIG. 14, the differential amplifier 110 with the test oscillator, the MIX 220, and the IFA 230 are configured as one system; however, a plurality of sets of these elements can be included to realize a multi-channel configuration. The plurality of sets may be arranged on the same chip or different chips.

Figure 15:
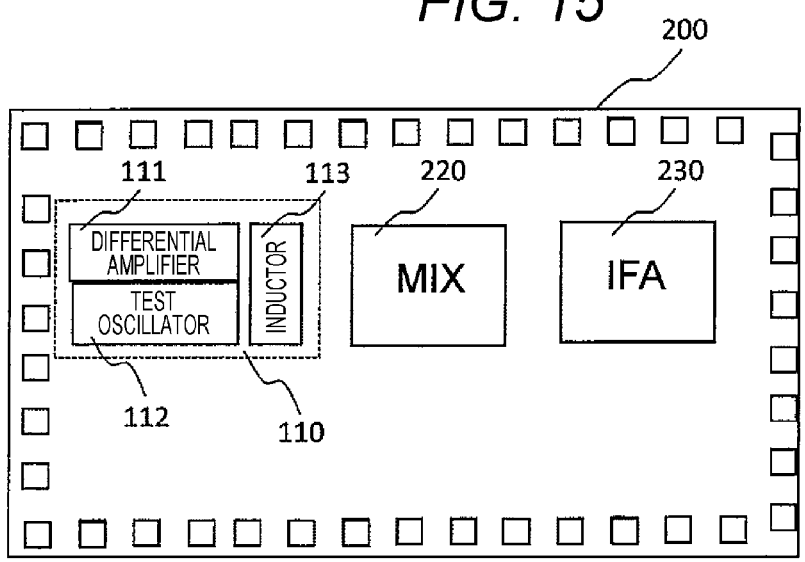
FIG. 15 is a plan view illustrating a block arrangement on a circuit layout of a transmitter IC according to an eleventh embodiment of the present invention.

FIG. 15 is a schematic diagram illustrating an arrangement of individual blocks on a chip layout of the receiver IC 200 according to the ninth embodiment. As described in the first embodiment, transistors of the differential amplifier 111 and the test oscillator 112 in the differential amplifier 110 with the test oscillator preferably have the same current driving ability in terms of securing precision at the time of the IC shipment test. For this reason, in the layout arrangement of the differential amplifier 111 and the test oscillator 112, the differential amplifier 111 and the test oscillator 112 are preferably close to each other, as illustrated in FIG. 15. In addition, when the arrangement of the transistors of the differential amplifier 111 and the test oscillator 112 has the common centroidal structure illustrated in FIG. 4, test precision can be further improved.

According to this embodiment, in the receiver IC 200, good noise performance can be secured in the normal operation mode and a built-in high frequency signal source for a test is provided to make an externally attached expensive high frequency signal source unnecessary, so that a test cost at the time of an IC shipment can be suppressed. Note that in the ninth embodiment, since power matching and noise matching of an input step can be achieved at the same time by using the differential amplifier 110 with the test oscillator described in the seventh embodiment, noise performance can be improved as compared with the differential amplifier 110 with the test oscillator illustrated in each of the first to fifth embodiments.

Tenth Embodiment

Figure 16:
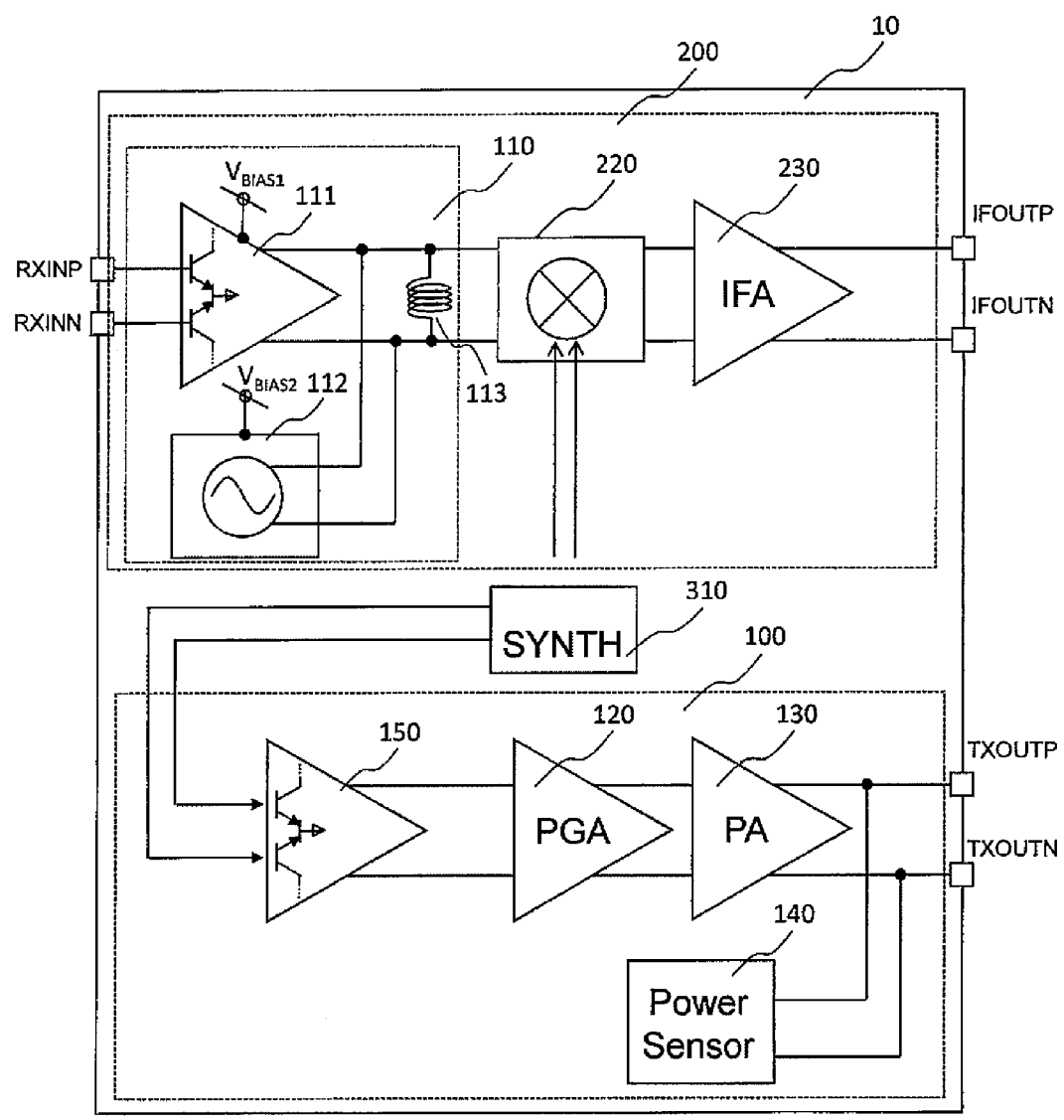
FIG. 16 is a block diagram illustrating a configuration of a transceiver IC according to a twelfth embodiment of the present invention.

A transceiver IC according to a tenth embodiment will be described on the basis of FIG. 16.

A transceiver IC 10 according to the tenth embodiment includes a transmission block 100, a reception block 200, and a SYNTH 310.

The reception block 200 includes at least the differential amplifier 110 with the test oscillator illustrated in each of the first to sixth embodiments, a MIX 220 that mixes an output signal of the differential amplifier 110 with the test oscillator and a local signal of a high frequency supplied from the SYNTH 310 in the transceiver IC 300, performs frequency conversion, and generates an intermediate frequency signal, and an IFA 230 that amplifies the intermediate frequency signal generated by the MIX 220 to an appropriate signal level.

The transmission block 100 includes an input differential amplifier 150, a PGA 120 that can control circuit gain arbitrarily, a PA 130 that outputs power to drive a transmission antenna outside the IC, and a power sensor 140 that outputs a direct-current voltage or a direct current proportional to an output signal level of a high frequency output signal of the PA 120.

The SYNTH 310 (frequency synthesizer) supplies a high frequency signal to the transmission block and the MIX 220 in the reception block in a normal operation mode.

An output of the SYNTH 310 in the transceiver IC 10 is connected to the input differential amplifier 150 of the transmission block 100 and the MIX 220 of the reception block. In the transmission block 100, an output of the input differential amplifier 150 is connected to the PGA 120, an output of the PGA 120 is connected to the PA 130, and an output of the PA 130 is connected to the power sensor 140 and transmission output terminals TXOUTP and TXOUTN of the transceiver IC 10. Meanwhile, in the reception block 200, input terminals RXINP and RXINN of the transceiver IC 10 are connected to the differential amplifier 110 with the test oscillator, an output of the differential amplifier 110 with the test oscillator and a local signal of the SYNTH 310 are connected to the MIX 220, an output of the MIX 220 is connected to the IFA 230, and an output of the IFA 230 is connected to output terminals IFOUTP and IFOUTN of the transceiver IC 10.

Next, a circuit operation in the tenth embodiment will be described. The transceiver IC 10 according to this embodiment has at least two operation modes in a similar manner to the first to ninth embodiments. A first operation mode is a normal operation mode in which, in the transmission block 100, a high frequency signal generated from the SYNTH 310 is amplified and then is output to the outside and in the reception block 200, a high frequency signal input from the outside of the transceiver IC 10 is amplified, the high frequency signal is then down-converted into an intermediate frequency by the MIX 220, and an intermediate frequency band signal amplified by the IFA 230 is output to the outside.

A second operation mode is a test operation mode in which, at the time of a shipment test of the transceiver IC 10, in the transmission block 100, a high frequency signal generated from the SYNTH 310 is amplified by a transmission chain, and a signal level of the amplified high frequency signal is confirmed to confirm whether the circuit is normally operated and in the reception block, a high frequency signal is generated from a test oscillator 112 in the differential amplifier 110 with the test oscillator implemented inside of the transceiver IC 10, and a signal level of an intermediate frequency band signal down-converted into an intermediate frequency band by the MIX 220 is confirmed to confirm whether the circuit is normally operated.

In the first normal operation mode, in the transmission block 100, the high frequency signal supplied by the SYNTH 310 passes through a transmission chain connected to the input differential amplifier 150, the PGA 120, and the PA 130, so that the high frequency signal is amplified, and the high frequency signal is output to the outside of the transceiver IC 10. In the reception block 200, a bias voltage of the bias voltage terminal VBIAS2 described in the first embodiment is decreased to a GND level and the test oscillator 112 is turned off. Meanwhile, a direct-current voltage value at which a differential amplifier 111 is normally operated is applied as a bias voltage of the bias voltage terminal VBIAS1 also described in the first embodiment and the differential amplifier is turned on. As a result, the transceiver IC 10 can amplify an external input signal passing through a reception chain connected to the differential amplifier 111, the MIX 220, and the IFA 230 and output the external input signal to the outside of the transceiver IC 10.

In the second test operation mode, in the transmission block 100, the high frequency signal supplied by the SYNTH 310 is amplified by the input differential amplifier 150, the PGA 120, and the PA 130, is then input to the power sensor 140, and is converted into a direct-current voltage or a direct current according to a signal level of the high frequency signal and a direct-current voltage value or a direct current value thereof is monitored. Meanwhile, in the reception block 200, in a similar manner to the ninth embodiment, the bias voltage of the bias voltage terminal VBIAS1 is decreased to the GND level and the differential amplifier 111 is turned off. Meanwhile, a direct-current voltage value at which the test oscillator 112 is normally operated is applied as the bias voltage of the bias voltage terminal VBIAS2 and the test oscillator is turned on. As a result, the test oscillator 112 outputs an oscillation signal at a resonance frequency determined by parasitic capacities such as an inductor 113, capacitors 114 and 115, and transistors. The high frequency signal generated by the test oscillator 112 is down-converted into an intermediate frequency band signal by the MIX 220 and is amplified by the IFA 230 and then a signal level of the intermediate frequency band signal in the output terminals OUTP and OUTN of the transceiver IC 10 is monitored. Since a frequency of the above-described intermediate frequency band signal is sufficiently low as compared with a frequency of the high frequency signal generated by the above-described test oscillator 112, a signal level thereof can be measured without requiring an expensive measurer.

According to this embodiment, in the transceiver IC 10, good noise performance can be secured in the normal operation mode and a built-in high frequency signal source for a test is provided to make an externally attached expensive high frequency signal source unnecessary, so that a test cost at the time of an IC shipment can be suppressed. Note that in the tenth embodiment, since power matching and noise matching of an input step can be achieved at the same time by using the differential amplifier 110 with the test oscillator described in the seventh embodiment, noise performance can be improved as compared with the differential amplifier 110 with the test oscillator illustrated in each of the first to fifth embodiments.

Eleventh Embodiment

Figure 17:
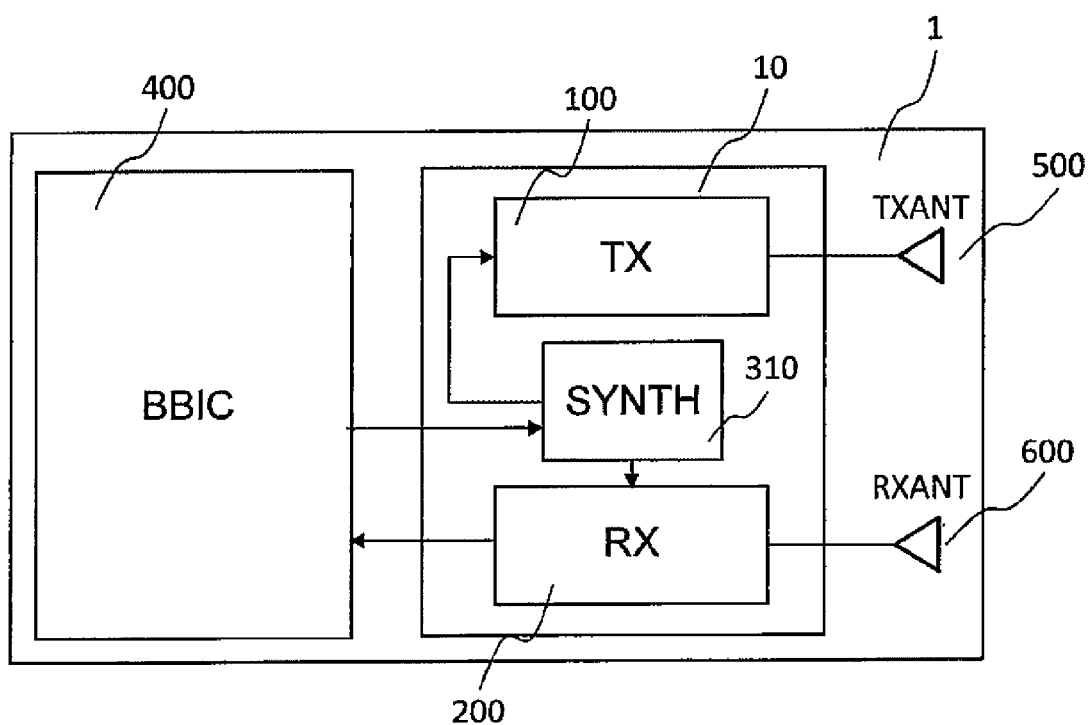
FIG. 17 is a block diagram illustrating a configuration of a millimeter-wave radar module according to a thirteenth embodiment of the present invention.

A millimeter-wave radar module according to an eleventh embodiment will be described on the basis of FIG. 17.

A millimeter-wave radar module 1 according to the eleventh embodiment includes at least any one of the high frequency IC 110, the transmitter IC 100, the receiver IC 200, and the transceiver IC 10 illustrated in the first to tenth embodiments, a BBIC 400, a transmission antenna TXANT 500, and a reception antenna RXANT 600. In this embodiment, the millimeter-wave radar module 1 including the transceiver IC 10, the BBIC 400, the transmission antenna TXANT 500, and the reception antenna RXANT 600 will be described.

The millimeter-wave radar module 1 according to the tenth embodiment controls a modulation operation of a high frequency signal output from a SYNTH 310 in the transceiver IC 10 by a control signal from the BBIC 400. An output of the SYNTH 310 is connected to a transmission block 100, the transmission block 100 performs power amplification of an input high frequency signal and is connected to the transmission antenna 500, and the transmission antenna 500 emits the input high frequency signal to space. The high frequency signal received by the reception antenna 600 is input to the reception block 200 in the transceiver IC 10 and the reception block 200 performs amplification and down-conversion of the received high frequency signal and outputs a down-converted intermediate frequency band signal to the BBIC 400. In the BBIC 400, signal processing of the input intermediate frequency band signal is performed and detection of a target is performed.

According to this embodiment, since the millimeter-wave radar module 1 can be realized using the high frequency IC 110, the transmitter IC 100, the receiver IC 200, and the transceiver IC 10 of a low cost illustrated in the first to tenth embodiments, a cost of the millimeter-wave radar module can be reduced.

The components represented in a singular form in the present specification may be represented in a plural form, unless the context clearly and specifically indicates a singular form.

The present invention is not limited to the embodiments described above and various modifications are included. For example, a part of a configuration of a certain embodiment can be replaced by a configuration of another embodiment and the configuration of another embodiment can also be added to the configuration of the certain embodiment. In addition, as for a part of a configuration of each embodiment, addition, deletion, and replacement of the configuration of another embodiment are possible.

The invention claimed is:

1. A high frequency IC, at least comprising:
an inductive load;
an amplifier;
an oscillator; and
a second inductor and a third inductor,
wherein the amplifier and the oscillator commonly use the inductive load,
wherein the amplifier has a first bias voltage terminal to switch an operation state of the amplifier into an active state/inactive state, and
wherein the oscillator has a second bias voltage terminal to switch an operation state of the oscillator into an active state/inactive state, and
wherein an emitter terminal of the first transistor and an emitter terminal of the second transistor of the amplifier are connected through the second inductor and the third inductor and are rounded in an alternating-current manner.

2. The high frequency IC according to claim 1, comprising:
first and second varactors,
wherein each of the first and second varactors has first and second terminals,
the first terminal of the first varactor is connected to the first terminal of the inductive load,
the first terminal of the second varactor is connected to the second terminal of the inductive load, and
a power supply terminal for frequency control is connected to the second terminal of each of the first and second varactors.

3. A high frequency IC, at least comprising:
an inductive load;
an amplifier; and
an oscillator,
wherein the amplifier and the oscillator commonly use the inductive load,
the amplifier has a first bias voltage terminal to switch an operation state of the amplifier into an active state/inactive state, and
the oscillator has a second bias voltage terminal to switch an operation state of the oscillator into an active state/inactive state,
the inductive load includes first, second, and third terminals, an output terminal pair of the high frequency IC are configured by the first and second terminals, and the third terminal is connected to a power supply terminal,
the amplifier includes a first transistor and a second transistor,
a base terminal of the first transistor and a base terminal of the second transistor serve as an input pair of the high frequency IC,
an emitter terminal of the first transistor and the second emitter terminal are connected to each other and are grounded in an alternating-current manner,
a collector terminal of the first transistor is connected to the first terminal of the inductive load,
a collector terminal of the second transistor is connected to the second terminal of the inductive load,
the first bias voltage terminal is connected to the base terminal of the first transistor and the base terminal of the second transistor,
the oscillator includes third and fourth transistors and first and second capacitive elements,
emitter terminals of the third transistor and the fourth transistor are connected to each other and are grounded in a high-frequency manner,
a collector terminal of the third transistor is connected to a base terminal of the fourth transistor through the first terminal of the inductive load and the first capacitive element,
a collector terminal of the fourth transistor is connected to the second terminal of the inductive load and a base terminal of the third transistor to form a positive feedback loop, and
the second bias voltage terminal is connected to the base terminal of the first transistor and the base terminal of the second transistor.

4. The high frequency IC according to claim 3,
wherein the inductive load is a transformer that has first, second, third, fourth, and fifth terminals,
a primary-side inductor is formed between the first terminal and the second terminal,
a secondary-side inductor is formed between the fourth terminal and the fifth terminal,
the third terminal is connected to the power supply terminal, and
the output terminal pair of the high frequency IC is configured by the fourth terminal and the fifth terminal.

5. The high frequency IC according to claim 3,
wherein the amplifier further includes a fifth transistor and a sixth transistor,
the base terminal of the first transistor and the base terminal of the second transistor serve as the input pair of the high frequency IC, the emitter terminal of the first transistor and the second emitter terminal are connected to each other and are grounded in an alternating-current manner, the collector terminal of the first transistor is connected to an emitter terminal of the fifth transistor, the collector terminal of the second transistor is connected to an emitter terminal of the sixth transistor, base terminals of the fifth and sixth transistors are connected to the power supply terminal, a collector terminal of the fifth transistor is connected to the first terminal of the inductive load, a collector terminal of the sixth transistor is connected to the second terminal of the inductive load, and the first bias voltage terminal is connected to the base terminal of the first transistor and the base terminal of the second transistor.

6. The high frequency IC according to claim 5, wherein the inductive load is a transformer that has first, second, third, fourth, and fifth terminals, a primary-side inductor is formed between the first terminal and the second terminal, a secondary-side inductor is formed between the fourth terminal and the fifth terminal, the third terminal is connected to the power supply terminal, and the output terminal pair of the high frequency IC is configured by the fourth terminal and the fifth terminal.

7. A high frequency IC, comprising:

an inductive load;

an amplifier;

an oscillator; and a power sensor, wherein the power sensor is connected to an output terminal of the amplifier, the inductive load is connected to a load side of the amplifier, the inductive load is connected to an output side of the oscillator, the amplifier has a first bias voltage terminal to switch an operation state of the amplifier into an active state/inactive state, the oscillator has a second bias voltage terminal to switch an operation state of the oscillator into an active state/inactive state, and it is possible to perform control that the amplifier is inactivated and the oscillator is activated in a test operation mode and the amplifier is activated and the oscillator is inactivated in a normal operation mode.

8. The high frequency IC according to claim 7, further comprising:

a variable gain amplifier; and a power amplifier, wherein an input terminal of the high frequency IC is connected to the amplifier, the output terminal of the amplifier is connected to the variable gain amplifier, an output terminal of the variable gain amplifier is connected to the power amplifier, and an output terminal of the power amplifier serves as an output terminal of the transmitter IC and is connected to the power sensor to configure at least a part of a transmitter.

9. The high frequency IC according to claim 7, further comprising:

a frequency converter; and an intermediate frequency amplifier, wherein an input terminal of the high frequency IC is connected to the amplifier, the output terminal of the amplifier is connected to the frequency converter, a signal frequency-converted by the frequency converter is connected to the intermediate frequency amplifier, and a signal amplified by the intermediate frequency amplifier is connected to an output terminal of the high frequency IC to configure at least a part of a receiver.

10. The high frequency IC according to claim 7, comprising:

a frequency generation block that generates a frequency;

a reception block that has the oscillator, the amplifier, a frequency converter, and an intermediate frequency amplifier; and a transmission block that has an input amplifier, a variable gain amplifier, a power amplifier, and a power sensor, wherein a high frequency signal generated by the frequency generation block is connected to the input amplifier of the transmission block and an LO terminal of the frequency converter of the reception block, in the transmission block, a high frequency signal input from the frequency generation block is amplified by the input amplifier and then is input to the variable gain amplifier, an output terminal of the variable gain amplifier is connected to the power amplifier, and an output terminal of the power amplifier serves as an output terminal of the transmission block and is connected to the power sensor, and in the reception block, an input terminal of the reception block is connected to the amplifier, an output terminal of the amplifier is connected to the frequency converter, a signal frequency-converted by the frequency converter is input to the intermediate frequency amplifier, and a signal amplified by the intermediate frequency amplifier is connected to an output terminal of the receiver block to configure at least a part of a transceiver.

11. A wireless communication module equipped with a high frequency IC, wherein the high frequency IC has an inductive load, an amplifier, and a test oscillator, the amplifier and the test oscillator commonly use the inductive load connected to output sides of the amplifier and the test oscillator, and the amplifier and the test oscillator are controlled by a mode switching signal that the amplifier is operated during a normal operation and the test transmitter is operated during a test.

12. The wireless communication module according to claim 11, wherein the high frequency IC is an IC for transmission which further includes a variable gain amplifier and a power amplifier, and in which an input terminal of the high frequency IC is connected to the amplifier, an output terminal of the amplifier is connected to the variable gain amplifier, an output terminal of the variable gain amplifier is connected to the power amplifier, and an output terminal of the power amplifier serves as an output terminal of the transmitter IC and is connected to the power sensor, or the high frequency IC is an IC for reception which further includes
a frequency converter and an intermediate frequency amplifier, and in which
the input terminal of the high frequency IC is connected to the amplifier,
the output terminal of the amplifier is connected to the frequency converter,
a signal frequency-converted by the frequency converter is connected to the intermediate frequency amplifier, and
a signal amplified by the intermediate frequency amplifier is connected to an output terminal of the high frequency IC, and
the wireless communication module is equipped with one of the IC for transmission and the IC for reception, both the IC for transmission and the IC for reception, or an IC for transmission and reception obtained by integrating the IC for transmission and the IC for reception.

13. The wireless communication module according to claim 11,
wherein the inductive load includes first, second, and third terminals, an output terminal pair of the high frequency IC is configured by the first and second terminals, and the third terminal is connected to a power supply terminal,
the amplifier includes a first transistor and a second transistor,
a base terminal of the first transistor and a base terminal of the second transistor serve as an input pair of the high frequency IC,
an emitter terminal of the first transistor and the second emitter terminal are connected to each other and are grounded in an alternating-current manner,
a collector terminal of the first transistor is connected to the first terminal of the inductive load,
a collector terminal of the second transistor is connected to the second terminal of the inductive load,
the first bias voltage terminal is connected to the base terminal of the first transistor and the base terminal of the second transistor,
the test oscillator includes third and fourth transistors and first and second capacitive elements,
emitter terminals of the third transistor and the fourth transistor are connected to each other and are grounded in a high-frequency manner,
a collector terminal of the third transistor is connected to a base terminal of the fourth transistor through the first terminal of the inductive load and the first capacitive element,
a collector terminal of the fourth transistor is connected to the second terminal of the inductive load and a base terminal of the third transistor to form a positive feedback loop, and
the second bias voltage terminal is connected to the base terminal of the first transistor and the base terminal of the second transistor.

14. The wireless communication module according to claim 11,
wherein the high frequency IC further has a power sensor, and
during the test, a high frequency signal generated from the test transmitter is converted by the power sensor into a direct-current voltage or a direct-current voltage according to a signal level of the high frequency signal.

* * * * *